United States Patent
Ha et al.

(10) Patent No.: US 8,525,570 B2
(45) Date of Patent: Sep. 3, 2013

(54) LEVEL SHIFTER

(75) Inventors: Sang Hoon Ha, Gyunggi-do (KR);
Shinichi Iizuka, Gyunggi-do (KR);
Youn Suk Kim, Gyunggi-do (KR); Jun Kyung Na, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 57 days.

(21) Appl. No.: 13/212,824

(22) Filed: Aug. 18, 2011

(65) Prior Publication Data

US 2012/0049925 A1 Mar. 1, 2012

(30) Foreign Application Priority Data

Aug. 27, 2010 (KR) .................. 10-2010-0083606

(51) Int. Cl.
*H03L 5/00* (2006.01)

(52) U.S. Cl.
USPC ......................................... 327/333; 327/561

(58) Field of Classification Search
USPC .................. 326/62–63, 80–82; 327/306, 333, 327/560–561
See application file for complete search history.

(56) References Cited

U.S. PATENT DOCUMENTS 5,294,845 A * 3/1994 McMahan et al. .............. 326/21
7,898,555 B2 * 3/2011 Kudo et al. .................... 345/690

FOREIGN PATENT DOCUMENTS

| JP | 2007-300583 | 11/2007 |
| KR | 1998-064878 | 11/1998 |

* cited by examiner

*Primary Examiner* — Dinh T. Le
(74) *Attorney, Agent, or Firm* — McDermott Will & Emery LLP

(57) ABSTRACT

A level shifter includes: a first buffer amplifier transferring a preset reference voltage to a first output terminal; a second buffer amplifier connected in parallel to the first buffer amplifier and transferring an input voltage to a second output terminal; a positive feedback amplifier connected in parallel to the first buffer amplifier and the second buffer amplifier, and amplifying the input voltage by a preset gain to transfer the amplified input voltage to a third output terminal; and a level regulation unit regulating levels of output signals of the first buffer amplifier, the second buffer amplifier, and the positive feedback amplifier and providing the regulated output signals to a common output node.

8 Claims, 2 Drawing Sheets

LEVEL SHIFTER

CROSS-REFERENCE TO RELATED APPLICATIONS

This application claims the priority of Korean Patent Application No. 10-2010-0083606 filed on Aug. 27, 2010, in the Korean Intellectual Property Office, the disclosure of which is incorporated herein by reference.

BACKGROUND OF THE INVENTION

1. Field of the Invention

The present invention relates to a level shifter which is applicable to a power amplification system, and more particularly, to a level shifter in which a plurality of amplifiers are connected in parallel, whereby a forward isolation spec of a power amplifier can be improved and the level shifter can be relatively scaled down.

2. Description of the Related Art

At present, a great deal of research has been conducted into a power amplifier (PA) using complementary-metal-oxide-semiconductor (CMOS) technology. A power amplifier includes a high frequency block which manages signal transmission and reception, and an analog control block which controls the power amplifier. The analog control block needs to be delicately operated.

In particular, many circuit design technologies are integrated into the analog control block in order to meet the operational specification of the power amplifier.

Typically, a level shifter may be used when it is necessary to change an input voltage range to a desired output voltage range.

As for a conventional level shifter, a reference buffer and an input buffer are connected in parallel, and an output amplifier is connected to an output node to which output terminals of the reference buffer and the input buffer are commonly connected.

In such a conventional level shifter, an input voltage (Vin) ranges from 0 V to 0.2 V in a standby mode. In the standby mode, the power amplifier is in an off state. Thus, output power of the power amplifier should meet a forward isolation spec of the power amplifier. That is, the output power of the power amplifier should be lower than a reference power.

To meet the forward isolation spec of the power amplifier, the output voltage (Vout) of the conventional level shifter should be low when the input voltage (Vin) ranges from 0 V to 0.2 V.

In an off period (0-0.2 V) of the power amplifier, the conventional level shifter should meet the forward isolation spec. However, even in a low input voltage (0-0.2 V), the conventional level shifter may generate an output voltage higher than a predetermined voltage. Therefore, the conventional level shifter may not meet the forward isolation spec of the power amplifier.

SUMMARY OF THE INVENTION

An aspect of the present invention provides a level shifter in which a plurality of amplifiers are connected in parallel, whereby a forward isolation spec of a power amplifier can be improved and the level shifter can be relatively scaled down.

According to an aspect of the present invention, there is provided a level shifter including: a first buffer amplifier transferring a preset reference voltage to a first output terminal; a second buffer amplifier connected in parallel to the first buffer amplifier and transferring an input voltage to a second output terminal; a positive feedback amplifier connected in parallel to the first buffer amplifier and the second buffer amplifier, and amplifying the input voltage by a preset gain to transfer the amplified input voltage to a third output terminal; and a level regulation unit regulating levels of output signals of the first buffer amplifier, the second buffer amplifier, and the positive feedback amplifier and providing the regulated output signals to a common output node.

The level regulation unit may include: a first level regulator connected between the first output terminal of the first buffer amplifier and the common output node; a second level regulator connected between the second output terminal of the second buffer amplifier and the common output node; and a third level regulator connected between the third output terminal of the positive feedback amplifier and the common output node.

According to another aspect of the present invention, there is provided a level shifter including: a first buffer amplifier transferring a preset reference voltage to a first output terminal; a second buffer amplifier connected in parallel to the first buffer amplifier and transferring an input voltage to a second output terminal; a positive feedback amplifier connected in parallel to the first buffer amplifier and the second buffer amplifier, and amplifying the input voltage by a preset gain to transfer the amplified input voltage to a third output terminal; and a level regulation unit including: a first level regulator connected between the first output terminal of the first buffer amplifier and the common output node; a second level regulator connected between the second output terminal of the second buffer amplifier and the common output node; and a third level regulator connected between the third output terminal of the positive feedback amplifier and the common output node.

The first buffer amplifier, the second amplifier, and the positive feedback amplifier may be supplied with a preset regulator voltage as an operating voltage.

The reference voltage of the first buffer amplifier may be set to be higher than 0 V in order to prevent a response delay in an operational amplifier.

The preset gain of the positive feedback amplifier may be set to be greater than 1.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
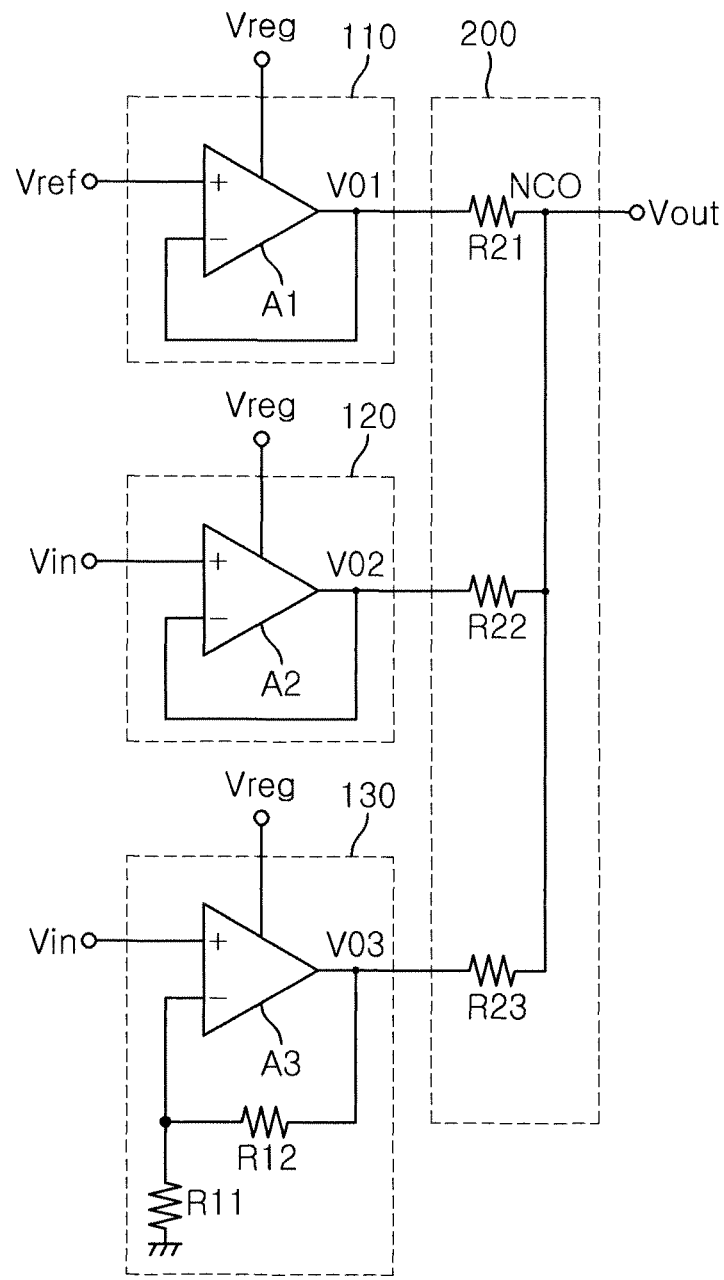
FIG. 1 is a circuit block diagram of a level shifter according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of FIG. 1 is a circuit block diagram of a level shifter according to an embodiment of the present invention.

Referring to FIG. 1, the level shifter according to the embodiment of the present invention may include a first buffer amplifier 110, a second buffer amplifier 120, a positive feedback amplifier 130, and a level regulation unit 200. The first buffer amplifier 110 transfers a preset reference voltage Vref to a first output terminal. The second buffer amplifier 120 is connected in parallel to the first buffer amplifier 110, and transfers an input voltage Vin to a second output terminal. The positive feedback amplifier 130 is connected in parallel to the first buffer amplifier 110 and the second buffer amplifier 120, and amplifies the input voltage Vin by a preset gain to transfer the amplified input voltage to a third output terminal. The level regulation unit 200 regulates the levels of the output signals of the first buffer amplifier 110, the second buffer amplifier 120, and the positive feedback amplifier 130, and provides the regulated output voltages to a common output node NCO.

Meanwhile, the first buffer amplifier 110 may be implemented with a first operational amplifier A1 which has a noninverting input terminal receiving the reference voltage Vref, and an inverting terminal connected to an output terminal thereof.

In addition, the second buffer amplifier 120 may be implemented with a second operational amplifier A2 which has a noninverting terminal receiving the input voltage Vin, and an inverting terminal connected to an output terminal thereof.

The positive feedback amplifier 130 may be implemented with a third operational amplifier A3 which has a noninverting terminal receiving the input voltage Vin, and an inverting terminal connected to a ground terminal through a first resistor R11 and connected to an output terminal thereof through a second resistor R12.

The first buffer amplifier 110, the second buffer amplifier 120, and the positive feedback amplifier 130 may be supplied with a preset regulator voltage Vreg as an operating voltage.

The reference voltage Vref of the first buffer amplifier 110 may be set to be higher than 0 V in order to prevent the response delay in the operational amplifier.

The preset gain of the positive feedback amplifier 130 may be set to be greater than 1.

The level regulation unit 200 may include a first level regulator R21, a second level regulator R22, and a third level regulator R23. The first level regulator R21 is connected between the first output terminal of the first buffer amplifier 110 and the common output node NCO. The second level regulator R22 is connected between the second output terminal of the second buffer amplifier 120 and the common output node NCO. The third level regulator R23 is connected between the third output terminal of the positive feedback amplifier 130 and the common output node NCO.

As an example, the first level regulator R21, the second level regulator R22, and the third level regulator R23 may be implemented with fixed resistors.

As another example, the first level regulator R21, the second level regulator R22, and the third level regulator R23 may be implemented with variable resistors.

Figure 2:
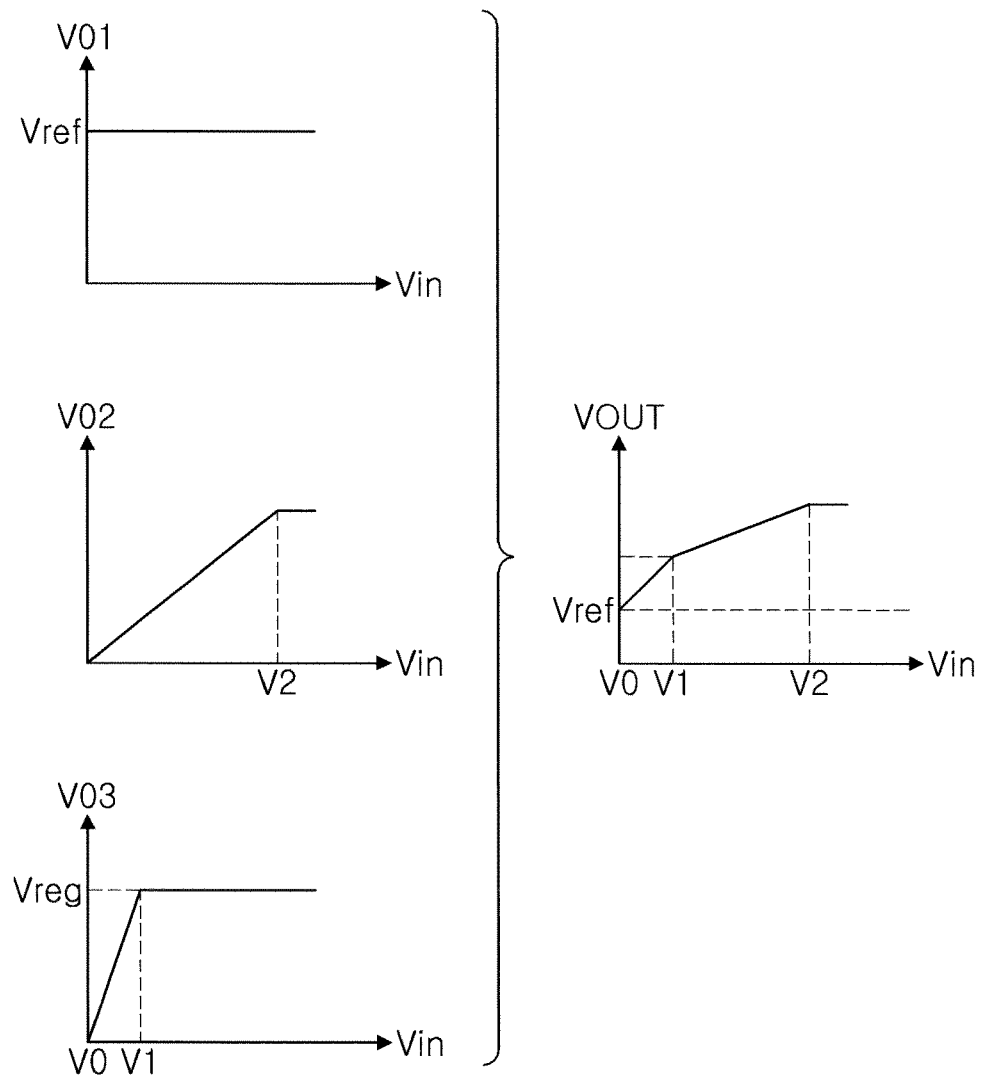
FIG. 2 is a graph showing a level of an output voltage of the level shifter according to the embodiment of the present invention.

FIG. 2 is a graph showing the level of the output voltage of the level shifter according to the embodiment of the present invention. In FIG. 2, VO1, VO2 and VO3 denote the output voltage of the first buffer amplifier 110, the output voltage of the second buffer amplifier 120, and the output voltage of the positive feedback amplifier 130, respectively.

In addition, V1 denotes the level of the input voltage which is amplified to make the output voltage VO3 of the positive feedback amplifier 130 equal to the regulator voltage Vreg. For example, the level of the amplified input voltage may be 0.2 V or less.

V2 denotes the level of the input voltage which is amplified to make the output voltage VO2 of the second buffer amplifier 130 equal to the regulator voltage Vreg. For example, the level of the amplified input voltage may range from 0.7 V to 1.3 V.

Hereinafter, the operation and effect of the present invention will be described with reference to the accompanying drawings.

The level shifter according to the present invention will be described below with reference to FIGS. 1 and 2. First, the level shifter of FIG. 1, according to the embodiment of the present invention, is designed so that the first buffer amplifier 110, the second buffer amplifier 120, and the positive feedback amplifier 130 are connected in parallel to one another.

The first buffer amplifier 110 transfers the preset reference voltage Vref to the common output node NCO through the level regulation unit 200.

The first buffer amplifier 110 is supplied with the preset regulator voltage Vreg as the operating voltage. The reference voltage Vref has a preset fixed magnitude. In order to prevent a response delay when the power amplifier is at 0 V, the reference voltage may be set to be higher than 0 V even when the input voltage is 0 V.

Specifically, when the present invention is applied to the power amplifier, the input voltage should not be 0 V in order to prevent the occurrence of the response delay in the operational amplifier included in the power amplifier. To this end, the reference voltage Vref may be set to higher than 0 V and lower than or equal to 0.2 V.

The first level regulator R21 of the level regulation unit 200 can regulate the level of the output signal of the first buffer amplifier 110.

Therefore, the output voltage VO1 of the first buffer amplifier 110 can prevent the response delay in the power amplifier to which the present invention is applied.

In addition, the second buffer amplifier 120 is connected in parallel to the first buffer amplifier 110, and transfers the input voltage Vin to the common output node NCO.

As in the first buffer amplifier 110, the second buffer amplifier 120 is supplied with the regulator voltage Vreg as the operating voltage. The input voltage Vin may be equal to or higher than 0 V. That is, the input voltage Vin may be a voltage which rises from 0 V at an initial input stage and reaches a predetermined voltage or more.

As such, the second buffer amplifier 120 transfers the input voltage Vin to the common output node NCO through the level regulation unit 200, with almost no change in the magnitude thereof.

Then, the second level regulator R22 of the level regulation unit 200 can regulate the level of the output signal of the second buffer amplifier 120.

In addition, the positive feedback amplifier 130 is connected in parallel to the first buffer amplifier 110 and the second buffer amplifier 120, and amplifies the input voltage Vin by a preset gain to transfer the amplified input voltage to the common output node NCO through the level regulation unit 200.

That is, the positive feedback amplifier 130 is supplied with the regulator voltage Vreg as the operating voltage, and amplifies the input voltage Vin by a preset gain greater than 1.

Therefore, as illustrated in FIG. 2, when the input voltage Vin is a voltage which rises at a constant slope, the output voltage VO3 of the positive feedback amplifier 130 has a slope greater than that of the output voltage VO2 of the second buffer amplifier 120. Hence, as illustrated in FIG. 2, the output voltage VO3 of the positive feedback amplifier 130 becomes equal to the regulator voltage Vreg at the voltage V1.

As illustrated in FIG. 2, when the input voltage is a voltage which rises gently, the voltage rises steeply when the voltage is V1 or less, rises gently between V1 and V2, and is maintained to be constant at a voltage higher than V2.

Then, the third level regulator R23 of the level regulation unit 200 can regulate the level of the output signal of the positive feedback amplifier 130.

As described above, since a low output voltage (an input voltage of a Low Drop Out (LDO) supplying a stable voltage to the power amplifier) is applied in the off period (0-0.2 V) of the power amplifier to which the present invention is applicable. Therefore, the power amplifier can output low power which meets the spec thereof.

As set forth above, according to exemplary embodiments of the invention, the plurality of amplifiers are connected in parallel, whereby the forward isolation spec of the power amplifier can be improved and the level shifter can be relatively scaled down.

While the present invention has been shown and described in connection with the exemplary embodiments, it will be apparent to those skilled in the art that modifications and variations can be made without departing from the spirit and scope of the invention as defined by the appended claims.

What is claimed is:

1. A level shifter comprising:
   a first buffer amplifier transferring a preset reference voltage to a first output terminal;
   a second buffer amplifier transferring an input voltage to a second output terminal;
   a positive feedback amplifier connected in parallel to the first buffer amplifier and the second buffer amplifier, and amplifying the input voltage by a preset gain to transfer the amplified input voltage to a third output terminal; and
   a level regulation unit regulating levels of output signals of the first buffer amplifier, the second buffer amplifier, and the positive feedback amplifier and providing the regulated output signals to a common output nod;
   wherein the level regulation unit comprises:
      a first level regulator connected between the first output terminal of the first buffer amplifier and the common output node;
      a second level regulator connected between the second output terminal of the second buffer amplifier and the common output node; and
      a third level regulator connected between the third output terminal of the positive feedback amplifier and the common output node.

2. The level shifter of claim 1, wherein the first buffer amplifier, the second amplifier, and the positive feedback amplifier are supplied with a preset regulator voltage as an operating voltage.

3. The level shifter of claim 2, wherein the first buffer amplifier includes an operational amplifier, the reference voltage of the first buffer amplifier is set to be higher than 0 V in order to prevent a response delay of the operational amplifier.

4. The level shifter of claim 3, wherein the preset gain of the positive feedback amplifier is set to be greater than 1.

5. A level shifter comprising:
   a first buffer amplifier transferring a preset reference voltage to a first output terminal;
   a second buffer amplifier transferring an input voltage to a second output terminal;
   a positive feedback amplifier connected in parallel to the first buffer amplifier and the second buffer amplifier, and amplifying the input voltage by a preset gain to transfer the amplified input voltage to a third output terminal; and
   a level regulation unit including:
   a first level regulator connected between the first output terminal of the first buffer amplifier and the common output node;
   a second level regulator connected between the second output terminal of the second buffer amplifier and the common output node; and
   a third level regulator connected between the third output terminal of the positive feedback amplifier and the common output nod;
   wherein the level regulation unit comprises:
      a first level regulator connected between the first output terminal of the first buffer amplifier and the common output node;
      a second level regulator connected between the second output terminal of the second buffer amplifier and the common output node; and
      a third level regulator connected between the third output terminal of the positive feedback amplifier and the common output node.

6. The level shifter of claim 5, wherein the first buffer amplifier, the second amplifier, and the positive feedback amplifier are supplied with a preset regulator voltage as an operating voltage.

7. The level shifter of claim 6, wherein the first buffer amplifier includes an operational amplifier, the reference voltage of the first buffer amplifier is set to be higher than 0 V in order to prevent a response delay of the operational amplifier.

8. The level shifter of claim 7, wherein the preset gain of the positive feedback amplifier is set to be greater than 1.

* * * * *